| United States Patent [19] | [11] Patent Number: 4,680,249 |
|---|---|
| Weed | [45] Date of Patent: Jul. 14, 1987 |

[54] PHOTOPOLYMERIZABLE COMPOSITION CONTAINING CARBOXY BENZOTRIAZOLE

[75] Inventor: Gregory C. Weed, Towanda, Pa.

[73] Assignee: E. I. Du Pont de Nemours and Company, Wilmington, Del.

[21] Appl. No.: 867,431

[22] Filed: May 28, 1986

[51] Int. Cl.$^4$ .............................................. G03C 1/76
[52] U.S. Cl. .................................. 430/281; 430/905; 430/910; 430/920; 522/9; 522/16; 522/63; 522/75; 524/91

[58] Field of Search ............... 430/281, 920, 905, 910; 524/91; 522/9, 16, 63, 75, 121

[56] References Cited

U.S. PATENT DOCUMENTS 3,622,334 11/1971 Hurley et al. ............................ 96/83
4,293,635 10/1981 Flint et al. ............................ 430/271

*Primary Examiner*—Jack P. Brammer

[57] ABSTRACT

Improved adhesion to a substrate is obtained employing a photopolymerizable composition containing a carboxy benzotriazole.

2 Claims, No Drawings

PHOTOPOLYMERIZABLE COMPOSITION CONTAINING CARBOXY BENZOTRIAZOLE

BACKGROUND OF THE INVENTION

The present invention relates to photosensitive compositions which contain an additive to influence the ability of the composition to adhere to a substrate; i.e., the composition which contains an adhesion promoter. The present invention also relates to photosensitive compositions which contain an amphoteric polymer as a binding agent.

U.S. Pat. No. 3,622,334 discloses a photopolymer resist composition which contains as an adhesion promoter a small amount of a heterocyclic nitrogen containing compound of the formula

where R is substituted or unsubstituted ortho arylene, X is $CH_2$, NH, S, O or Se; Z is N or C—Y and Y is H, $NH_2$, halogen or alkyl.

U.S. Pat. No. 4,293,635 discloses photosensitive compositions having reduced cold flow containing an addition polymerizable ethylenically unsaturated monomer, an initiating system activatable by actinic radiation and an amphoteric polymer.

BRIEF SUMMARY OF THE INVENTION

The present invention is directed to a photosensitive composition comprising
(a) addition polymerizable ethylenically unsaturated monomer,
(b) an initiating system activatable by actinic radiation
(c) an amphoteric polymer derived from interpolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character;
wherein the improvement comprises incorporation in the composition of
(d) a carboxy benzotriazole of the formula:

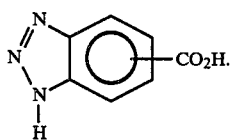

The present invention is directed to an improved composition and process compared to the photosensitive compositions disclosed in Flint and Pilette U.S. Pat. No. 4,293,635.

DETAILED DESCRIPTION OF THE INVENTION

In U.S. Pat. No. 4,293,635 photosensitive compositions are disclosed which have improved cold flow and comprise addition polymerizable ethylenically unsaturated monomer, an initiating system activatable by actinic radiation and an organic polymer binder which is amphoteric.

The disclosure of this publication is incorporated by reference herein. The present invention is directed to an improved composition which contains a specific adhesion promoter.

The use of amphoteric binders has been found to be beneficial in photosensitive compositions. These compositions are conventionally stored in roll form in contact with a support film. A cover film may be employed on the opposite surface of the photosensitive composition but in some embodiments is preferably eliminated due to cost savings and importantly due to difficulty in obtaining sufficient adhesion between the cover film and the photosensitive composition.

In use of these compositions such as a photoresist, lamination onto a substrate surface such as a copper clad fiberglass epoxy panel takes place. With many of the compositions which can be formulated with such binder, insufficient adhesion is present between the photosensitive film surface and the substrate surface which interferes with conventional processing such as development after imagewise exposure of the photosensitive material to actinic radiation. Conventional adhesion promoters have been generally found to impart insufficient adhesion characteristics. To overcome this problem in the photosensitive composition, use of a liquid interface between the two surfaces during lamination allows sufficient adhesion. Conventionally water which may contain surfactant is suitable to allow satisfactory lamination to proceed.

While use of a wetting liquid allows an adherent laminated photosensitive film to be obtained on a substrate surface, nevertheless, it is desirable in certain instances to laminate without a liquid, particularly if the substrate contains holes which a liquid could enter.

The use of the adhesion promoter of carboxy benzotriazole has been found to dramatically increase the dry adhesion of a photosensitive composition which contains an amphoteric binder particularly a composition for which unsatisfactory adhesion is obtained when laminated dry. The degree of adhesion can be measured in a test procedure wherein a photosensitive composition on a support film such as electric discharged treated polyethylene terephthalate is applied to a substrate, such as a copper clad panel. Immediately or a short time thereafter the support film is removed from the photosensitive composition. A pressure sensitive tape is applied to the surface of the composition and after about one and one half minutes the tape is peeled at a constant angle from the surface of the composition which can cause its removal with the tape.

The components of the present photosensitive composition except for the instant adhesion promoter are known as evidenced by the disclosure of U.S. Pat. No. 4,293,635.

The amphoteric polymers which are necessary components of the binder of the photosensitive compositions are interpolymers derived from the interpolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character.

The applicable N-substituted acrylamides or methacrylamides are substituted with alkyl radicals containing from 2-12 carbon atoms. Among the applicable acrylamides and methacrylamides are included N-ethyl acrylamide, N-tertiary-butyl acrylamide, N-n-octyl acrylamide, N-tertiary-octyl acrylamide, N-decyl acrylamide, N-dodecyl acrylamide, as well as the corresponding methacrylamides. Suitable aminoalkyl compounds are the $C_{1-4}$ alkyl ($C_{2-4}$) aminoalkyl acrylates and methacrylates.

Suitable acidic comonomers for the amphoteric polymers used in the invention are those having at least one available carboxylic acid group. These include acrylic acid, methacrylic acid, crotonic acid, itaconic acid, maleic acid, fumaric acid and the $C_1$–$C_4$ alkyl half esters of maleic and fumaric acids such for example, as methyl hydrogen maleate and butyl hydrogen fumarate as well as any other acidic monomers which are capable of being copolymerized with the particular interpolymer system whose use is desired by the practitioner. As is known to those skilled in the art, the acidic comonomer(s) must be so chosen as to be readily polymerizable with the selected interpolymer system.

In order to modify or enhance certain properties of the amphoteric polymer, such as adhesion, compatibility, water solubility, hardness, flexibility, antistatic properties and the like, any of the following acrylic and methacrylic comonomers can be used: acrylic and methacrylic acid esters of aliphatic alcohols having from 1 to 12 carbon atoms such as methyl, ethyl, propyl, butyl, octyl and lauryl alcohols; hydroxyalkyl esters of acrylic and methacrylic acids such as hydroxypropyl acrylate and methacrylate, hydroxybutyl acrylate and methacrylate, hydroxystearyl acrylate and methacrylate and hydroxyethyl acrylate and methacrylate; alkyl ($C_1$–$C_4$) amino alkyl ($C_2$–$C_4$) esters of arylic and methacrylic acids such as N,N'-diethylaminoethyl acrylate, N-tert.-butylaminopropyl acrylate, N,N'-dimethylaminoethyl methacrylate, N-tert.-butylaminoethyl methacrylate and the quaternization product of dimethylaminoethyl methacrylate and dimethyl sulfate, diethyl sulfate and the like; diacetone acrylamide; vinyl esters such as vinyl acetate and vinyl propionate; and styrene monomers such as styrene and alpha-methyl styrene.

Preferred amphoteric interpolymers are those containing from about 30–60% of the N-substituted acrylamide or methacrylamide, from 10–20%, (and 12–18%, preferably) of the acidic comonomer, and up to 55% of at least one copolymerizable comonomer; these percentages being based on the total weight of the interpolymer. The percentages given herein and in the claims are to be taken so that the comonomers of the interpolymer will total to 100%.

Particularly preferred because they combine the best combination of physical properties for the invention are those polymers containing from 35–45% of N-tert.-octyl acrylamide, from 12–18% of acrylic or methacrylic acid, from 32–38% of methyl methacrylate, from 2–10% of hydroxypropyl acrylate, and from 2–10% of an alkyl ($C_1$–$C_4$) amino alkyl ($C_2$–$C_4$) acrylate or methacrylate.

Suitable cobinders which can be used as the combination with the amphoteric polymer include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides; e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; and polyformaldehydes.

The cobinder preferably contains sufficient acidic or other groups to render the composition even more processible in aqueous developer. Useful aqueous-processible binders include those disclosed in U.S. Pat. No. 3,458,311 and in U.K. Pat. No. 1,507,704.

The amount of amphoteric polymer vis-à-vis the other binder constituent is largely a function of the properties desired. It has been found that at least about 2% wt. amphoteric polymer, basis binder, is needed to render the photosensitive layer nontacky and to evidence cold flow reduction. However, at least about 5% wt. amphoteric polymer is preferred and still higher amounts can also be used advantageously. Amount of amphoteric polymer up to 100% of the polymeric binder may be used with still further improvements in reduced cold flow. It will be recognized by those skilled in the art that the precise amount needed in a given system to obtain a reduced level of tackiness and/or cold flow will also depend, inter alia, on the ratio of plasticizing components to the binder.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such herteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)-anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoinitiators and photoinhibitors are sensitizers disclosed in U.S. Pat. No. 4,162,162.

The composition of the invention preferably also contains an inhibitor to prevent thermal polymerization of the photopolymerizable system.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may also be added to increase the visibility of the resist image. Any colorant used, however, should preferably be transparent to the actinic radiation used, although they may be opaque or strongly absorb other radiation in the visible or U.V. spectral region.

The photosensitive compositions of the invention will most frequently be employed as the photosensitive layer of a resist element in which the photosensitive layer is coated upon a support film.

In conventional photoresist elements it is necessary or at least highly desirable to protect the photosensitive layer by a removable cover sheet in order to prevent blocking between the photosensitive layer and the reverse surface of the support when they are stored in roll form. It is also desirable to protect the layer laminated to a substrate by means of the removable support film during imaging exposure to prevent blocking between the layer and the phototool. A very important advantage of the amphoteric interpolymer-containing photosensitive compositions is that the blocking tendency of the layer is sufficiently low that a cover sheet or support film need not be used. Thus because the photolayer also has low cold flow photoresist elements made from the photosensitive compositions of the invention need not have a cover sheet. It will, however, be recognized that a cover sheet may, nevertheless, be used if it is desired to do so. Similarly, such compositions need not have a support film during imaging exposure, which allows preparation of higher resolution resist images.

The photopolymerizable composition is coated upon a support at a dry coating thickness of, e.g., about 0.0003 inch (~0.0008 cm) to about 0.01 inch (~0.025 cm) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness, e.g., of from 0.00025 inch (~0.0006 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film, e.g., having a thickness of about 0.001 inch (~0.0025 cm).

In the following example are parts all percentages are by weight.

EXAMPLE

A coating composition having the following components is coated on a 1 mil polyethylene terephthalate film support and dried to give a thickness of 0.001 inch.

| Component | Parts By Weight |
|---|---|
| Terpolymer of 17% ethyl acrylate, 71% methylmethacrylate, and 12% acrylic acid; mol. wt. ca. 300,000; acid number ca. 105 | 2 |
| Interpolymer formed from 40% N—tert.-octyl acrylamide, 34% methylmethacrylate, 16% acrylic acid, 6% hydroxy propyl methacrylate, and 4% t-butyl amino ethyl methacrylate; mol. wt. ca. 500,000 | 63.85 |
| Trimethylolpropane triacrylate | 10.0 |
| Triethylene glycol dimethacrylate | 10.0 |
| Benzophenone | 8.0 |
| 4,4'-Bis(diethylamino) benzophenone | 0.12 |
| 2,2'-Bis(2-chlorophenyl)- 4,4',5,5'-tetraphenyl biimidazole | 1.50 |
| Leuco Crystal Violet | 0.30 |
| Victoria Green (C.I. Pigment Green 18) | 0.05 |
| Aerosol ® OT (sodium dioctyl sulfosuccinate) | 4.0 |
| Methylene chloride | 276.0 |
| Methanol | 24.0 |

The dried photoresist coating was laminated to a scrubbed copper clad glass-epoxy printed circuit substrate using a Riston ® hot roll laminator with the laminator rolls operating at 220° F. When normal removal of the polyethylene terephthalate support was attempted, portions of the resist layer were likewise removed indicating gross instant adhesion failure.

Five additional coatings were prepared as above with the components identified in the table. Using particular care in removing the support film after lamination the coatings were tested for instant adhesion.

The instant adhesion criteria (also designated "IA") is the ability of a resist film to resist delamination, e.g., when the film support is removed or the panel is trimmed, immediately after lamination, i.e., within about 15 to 20 minutes and before imaging exposure. Instant adhesion is measured by first removing the support film from a laminated resist panel and then adhering under finger pressure a uniform length of a 1 inch (25 mm) wide Scotch ® Brand Masking Tape to the surface of the rest. Within 90±30 seconds, the tape is peeled back at a constant angle between 90 and 180 deg) in one quick motion. The degree of instant adhesion, IA, is rated according to the percent of resist removed with the tape using the following scale:

Scale

5—No resist removed.
4—Up to 25% resist removed.
3—25% to 50% resist removed.
2—50% to 75% resist removed.
1—75% to 100% resist removed.
Results are as follows:

| Formulation Component | Properties | |
|---|---|---|
| | AMOUNT | IA |
| None | 0 | 1 |
| Benzotriazole | 0.20 | 1 |
| 5-Chloro benzotriazole | 0.26 | 1 |
| 5-Amino benzotriazole | 0.22 | 1 |
| 1-Methyl benzotriazole | 0.22 | 1 |
| 5-Carboxy benzotriazole | 0.27 | 5 |

Use of 5-carboxy benzotriazole significantly increased the instant adhesion compared to known additives of benzotriazole, 5-chloro benzotriazole, 5-amino benzotriazole and 5-methyl benzotriazole.

What is claimed is:

1. In a photosensitive composition comprising
   (a) addition polymerizable ethylenically unsaturated monomer,
   (b) an initiating system activatable by actinic radiation
   (c) an amphoteric polymer derived from interpolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character;
   wherein the improvement comprises incorporation in the composition of
   (d) a carboxy benzotriazole of the formula:

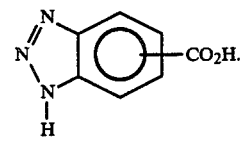

2. The composition of claim 1 wherein the carboxytriazole is 5-carboxy benzotriazole.

* * * * *